United States Patent
Kim et al.

(10) Patent No.: US 12,407,239 B2
(45) Date of Patent: Sep. 2, 2025

(54) TESTING APPARATUS FOR ACTIVE CURRENT CONTROL-TYPE NON-CONTACT SUPERCONDUCTIVE EXCITER HAVING HYBRID MAGNET INSTALLED THEREIN, AND HIGH-TEMPERATURE SUPERCONDUCTING ROTATING MACHINE USING SAME

(71) Applicant: INDUSTRY-ACADEMIC COOPERATION FOUNDATION JEJU NATIONAL UNIVERSITY, Jeju-si (KR)

(72) Inventors: Ho Min Kim, Jeju-si (KR); Ji Hyung Kim, Jeju-si (KR); Yoon Seok Chae, Jeju-si (KR); Yong Soo Yoon, Seoul (KR); Seung Hak Han, Hwaseong-si (KR)

(73) Assignee: INDUSTRY-ACADEMIC COOPERATION FOUNDATION JEJU NATIONAL UNIVERSITY, Jeju-si (KR)

( * ) Notice: Subject to any disclaimer, the term of this patent is extended or adjusted under 35 U.S.C. 154(b) by 206 days.

(21) Appl. No.: 18/255,397

(22) PCT Filed: Jan. 7, 2022

(86) PCT No.: PCT/KR2022/000259
§ 371 (c)(1),
(2) Date: Jun. 1, 2023

(87) PCT Pub. No.: WO2022/164070
PCT Pub. Date: Aug. 4, 2022

(65) Prior Publication Data
US 2024/0079945 A1    Mar. 7, 2024

(30) Foreign Application Priority Data
Jan. 29, 2021   (KR) .................... 10-2021-0012962

(51) Int. Cl.
*H02K 55/04*   (2006.01)
*G01R 31/34*   (2020.01)
(Continued)

(52) U.S. Cl.
CPC ........... *H02K 55/04* (2013.01); *G01R 31/346* (2013.01); *G01R 33/035* (2013.01); *H02K 1/276* (2013.01); *H02K 21/046* (2013.01)

(58) Field of Classification Search
CPC ...... H02K 55/04; H02K 1/276; H02K 21/046; H02K 1/17; H02K 1/146; H02K 15/00; G01R 31/346; G01R 33/035
See application file for complete search history.

(56) References Cited

U.S. PATENT DOCUMENTS

2008/0039331 A1\* 2/2008 Okazaki ................. H02K 55/04
                                                              505/166

FOREIGN PATENT DOCUMENTS

JP   2019-030153 A   2/2019
KR   10-1349362 B1   1/2014
(Continued)

OTHER PUBLICATIONS

KR-101766684-B1 machine translation Apr. 19, 2025.\*

*Primary Examiner* — Leda T Pham
(74) *Attorney, Agent, or Firm* — NKL LAW; Jae Youn Kim (57) ABSTRACT

Provided is a testing apparatus for an active current control-type non-contact superconductive exciter having a hybrid magnet installed therein, and a high-temperature superconductive rotating machine using same. Provided is principally characterized by having a hybrid magnet, in a module form, in which a permanent magnet, a DC electromagnet and an AC electromagnet are used together, wherein the hybrid magnet is set in a plurality along the circumferential direc- (Continued)

tion of a ring-shaped iron stator, is formed to correspond to the outer side of a rotor, having a high-temperature superconductive tape (or a second-generation high-temperature superconductive wire), of a non-contact superconductive exciter, and thus enables a selected operation (charging, discharging and the like) before and after rotation of a driving motor.

10 Claims, 9 Drawing Sheets

(51) Int. Cl.
*G01R 33/035* (2006.01)
*H02K 1/276* (2022.01)
*H02K 21/04* (2006.01)

(56) References Cited

FOREIGN PATENT DOCUMENTS

| | | | |
|---|---|---|---|
| KR | 101766684 B1 * | 8/2017 | |
| KR | 10-2098062 B1 | 4/2020 | |
| KR | 10-2189210 B1 | 12/2020 | |
| KR | 10-2274331 B1 | 7/2021 | |

* cited by examiner

< AC EM operation mode in initial charging >

< DC EM operation mode in normal current control >

TESTING APPARATUS FOR ACTIVE CURRENT CONTROL-TYPE NON-CONTACT SUPERCONDUCTIVE EXCITER HAVING HYBRID MAGNET INSTALLED THEREIN, AND HIGH-TEMPERATURE SUPERCONDUCTING ROTATING MACHINE USING SAME

TECHNICAL FIELD

The present invention relates to a testing apparatus for an active current control-type non-contact superconductive exciter having a hybrid magnet installed therein, and a high-temperature superconductive rotating machine using same, characterized by having hybrid magnets, in a module form, in each of which a permanent magnet, a DC electromagnet and an AC electromagnet are mixed together, wherein a plurality of hybrid magnets are set in a circumferential direction of a ring-shaped iron stator, are arranged to correspond to the outer side of a rotor having a second-generation high-temperature superconductive tape (or a second-generation high-temperature superconductive wire) of a non-contact superconductive exciter, and thus enables a selected operation (charging, discharging and the like) before and after a change of a rotational direction of a driving motor. Therefore, the present invention allows an active and immediate response to various operation environments such as starting current charging control, fixed field current control, field current control for magnetizing and demagnetizing control, field current and rotational direction change control in accordance with speed, and the like, thereby greatly enhancing an active control performance with respect to time-varying magnetic field compared to an existing technology.

BACKGROUND ART

In general, a synchronous rotator using an electromagnet as a rotor field should be electrically excited at the beginning of driving in order to synchronize with an armature of the synchronous rotator stator by having a separate excitation device.

A conventional excitation system for a high-temperature superconductive rotating machine includes a DC power source positioned at a room temperature portion in a mechanical contact manner, a set of a brush and a slip ring for supplying power to the rotating rotor field winding, and a metal or a superconductive current lead line connecting superconductive field windings of a room temperature portion and a cryogenic portion.

For excitation of the plurality of superconductive field windings, at least one DC power supply facility should be provided, which results in a disadvantage in which overall system efficiency is reduced due to the occurrence of a loss.

In addition, the brush and the slip ring, which transfer power by mechanical contact, require regular maintenance by mechanical friction, and cause mechanical vibration and noise.

In some cases, a flame phenomenon caused by poor contact may occur, resulting in an electrical accident.

Therefore, in order to prevent such problems, periodic maintenance is required, and the operation budget needs to be secured. However, it lowers the operation rate of the system, thereby leading to a problem in which overall economic feasibility is degraded.

Accordingly, in order to solve the above-described problems, patent right of Korean Patent No. 10-1766684 (hereinafter, called 'conventional art') has been granted to the applicant of the present invention.

The conventional art relates to a flux pump (superconductive power supply device) based on a rotary permanent magnet, wherein a non-contact type superconductive excitation device is applied to a high-temperature superconductive rotating machine to fundamentally remove an excitation system in a conventional mechanical contact.

However, in order to generate DC voltage that is the core of the non-contact type current charging principle, the conventional art must physically rotate the permanent magnet located in the stator unit or arbitrarily or unnecessarily rotate the rotor unit such that the magnetic field generated by the non-contact current charging should have time-variable.

Furthermore, in order to change a current amount charged in a non-contact manner by using a permanent magnet having a fixed magnetic flux size, it is the only way to change the time-variable of the interlinking magnetic fields, namely, a rotational speed and and a rotational direction, which are represented as relative speed differences. However, such a method can be applied only in a structure capable of physically rotating the permanent magnet.

As a result, the conventional art has a disadvantage in that the art is applicable only to the field to which the permanent magnet rotor having a constant field magnetic flux is applied since it is actually difficult to actively control the field current.

DISCLOSURE

Technical Problem

Accordingly, the present invention has been made in view of the above-mentioned problems occurring in the related art, and it is an object of the present invention to provide an actively controllable non-contact exciter having hybrid magnets, enabling initial charging without rotation of a rotor, current discharge compensation during reverse rotation, and control of current magnitude and charging speed according to operation environment.

In other words, it is an object of the present invention to provide an apparatus in which a plurality of hybrid magnets are set in a circumferential direction of a ring-shaped iron stator, are arranged to correspond to the outer side of a rotor having a second-generation high-temperature superconductive tape (or a second-generation high-temperature superconductive wire) of a non-contact superconductive exciter, and thus enables a selected operation (charging, discharging and the like) before and after a change of a rotational direction of a driving motor. Therefore, the present invention allows an active and immediate response to various operation environments such as starting current charging control, fixed field current control, field current control for magnetizing and demagnetizing control, field current and rotational direction change control in accordance with speed, and the like, thereby greatly enhancing an active control performance with respect to time-varying magnetic field compared to an existing technology.

Technical Solution

To accomplish the above-mentioned objects, according to the present invention, there is provided a testing apparatus for an active current control-type non-contact superconductive exciter having a hybrid magnet installed therein, including: a non-contact exciter rotor which is configured in such a way that a rotor having a high-temperature superconductive coil (HTS coil) part on one side and a second-generation high-temperature superconductive tape (HTS tape) part on the other side rotates around an axial line by a drive motor; and a non-contact exciter stator which includes a ring-shaped ferrous stator placed at a certain distance in the outer circumferential direction relative to the rotor having the second-generation high-temperature superconductive tape part, and a plurality of hybrid magnets mounted at regular intervals on the inner circumference surface of the ferrous stator, wherein the hybrid magnet is formed such that a permanent magnet is placed at the frontmost position based on a circular center point of the ferrous stator to generate a static magnetic field, an inner electromagnet partitioned based on an insulation plate is provided behind the permanent magnet to be connected to neighboring inner electromagnets, and an outer electromagnet partitioned based on the insulation plate is provided behind the inner electromagnet to be connected to neighboring outer electromagnets.

Moreover, the inner electromagnet is a DC electromagnet, and the outer electromagnet is an AC electromagnet.

Furthermore, the inner electromagnet is formed to supplement the static magnetic field of the permanent magnet by a DC power source after being connected in series with the neighboring inner electromagnets, and the outer electromagnet is formed to generate a rotor field capable of active control through an inverter after being connected in a three-phase Y-shaped connection with selected outer electromagnets among other outer electromagnets.

Additionally, the non-contact exciter stator includes an interlock transfer switch provided on a connection circuit between the inner electromagnets and on a connection circuit between the outer electromagnets.

In addition, a bearing or a rotary body is provided on one side of the rear end portion of the permanent magnet, and the permanent magnet coupled to the bearing or the rotary body is formed to be rotated according to the setting by a separate servo motor or a drive device.

Meanwhile, it is a finial objective of the present invention is to provide an exciter which is applied to the high-temperature superconductive rotating machine system.

Advantageous Effects

As described above, the present invention has the following effects. The hybrid magnets are provided in a module form, in each of which a permanent magnet, a DC electromagnet and an AC electromagnet are mixed together. A plurality of hybrid magnets are set in a circumferential direction of a ring-shaped iron stator, are arranged to correspond to the outer side of a rotor having a second-generation high-temperature superconductive tape (or a second-generation high-temperature superconductive wire) of a non-contact superconductive exciter, and thus enables a selected operation (charging, discharging and the like) before and after a change of a rotational direction of a driving motor. Therefore, the present invention allows an active and immediate response to various operation environments such as starting current charging control, fixed field current control, field current control for magnetizing and demagnetizing control, field current and rotational direction change control in accordance with speed, and the like, thereby greatly enhancing an active control performance with respect to time-varying magnetic field compared to an existing technology.

DESCRIPTION OF SYMBOLS IN DRAWINGS

100 . . . non-contact exciter rotor 110 . . . high-temperature superconductive coil
120 . . . second-generation high-temperature superconductive tape 130 . . . driving motor
200 . . . non-contact exciter stator 210 . . . ferrous stator
220 . . . hybrid magnet 221 . . . permanent magnet
222 . . . insulation plate 223 . . . inner electromagnet
224 . . . outer electromagnet 225 . . . interlock transfer switch

BEST MODE

The best mode for carrying out the present invention is to provide a testing apparatus for an active current control-type non-contact superconductive exciter having a hybrid magnet installed therein, including: a non-contact exciter rotor 100 which is configured in such a way that a rotor having a high-temperature superconductive coil (HTS coil) part 110 on one side and a second-generation high-temperature superconductive tape (HTS tape) part 120 on the other side rotates around an axial line by a drive motor 130; and a non-contact exciter stator 200 which includes a ring-shaped ferrous stator 210 placed at a certain distance in the outer circumferential direction relative to the rotor having the second-generation high-temperature superconductive tape part 120, and a plurality of hybrid magnets 220 mounted at regular intervals on the inner circumference surface of the ferrous stator 210, wherein the hybrid magnet 220 is formed such that a permanent magnet 221 is placed at the frontmost position based on a circular center point of the ferrous stator 210 to generate a static magnetic field, an inner electromagnet 223 partitioned based on an insulation plate 222 is provided behind the permanent magnet 221 to be connected to neighboring inner electromagnets, and an outer electromagnet 224 partitioned based on the insulation plate 222 is provided behind the inner electromagnet 223 to be connected to neighboring outer electromagnets.

MODE FOR INVENTION

Hereinafter, the present invention will be described in more detail with reference to the accompanying drawings.

As illustrated in FIGS. 1 to 5, the present invention includes a non-contact exciter rotor 100 and a non-contact exciter stator 200.

Figure 1:
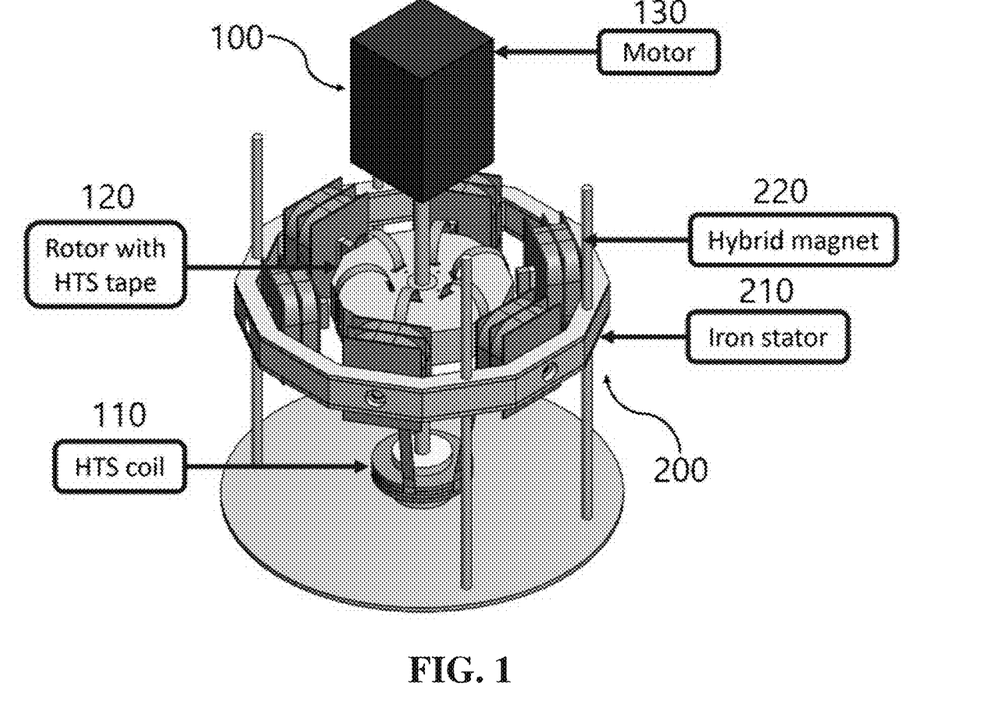
FIG. 1 is an exemplary diagram of a testing apparatus for an active current control-type non-contact superconductive exciter having a hybrid magnet installed therein according to the present invention.

The non-contact exciter rotor 100 is configured in such a way that a rotor having a high-temperature superconductive coil (HTS coil) part 110 on one side and a second-generation high-temperature superconductive tape (HTS tape) part 120 on the other side rotates around an axial line by a drive motor 130.

Here, the detailed configuration and description of the non-contact exciter rotor follow the basic principles of Korean Patent No. 10-1766684, filed and registered by the present applicant.

That is, the non-contact exciter rotor is formed such that current charging and discharging occur due to a time-varying magnetic field as the magnetic flux interlinkage between the rotor having the second-generation high-temperature superconductive tape and the non-contact exciter stator, which will be described later, is accumulated in a closed circuit (flux pumping).

Figure 2:
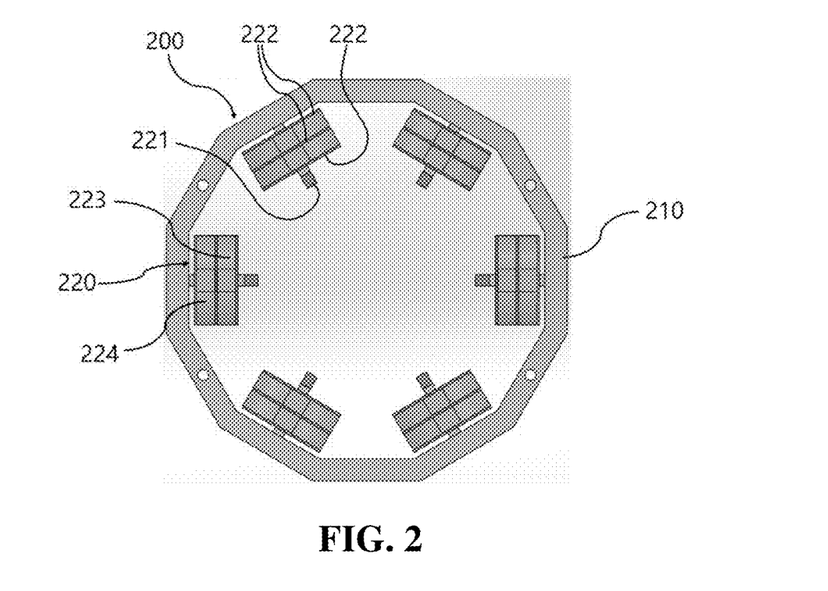
FIG. 2 is an exemplary plan view of a non-contact exciter stator according to the present invention.

Accordingly, the non-contact exciter stator 200 is formed such that a ring-shaped ferrous stator 210 is placed at a certain distance in the outer circumferential direction relative to the rotor having the second-generation high-temperature superconductive tape part 120.

At this time, the ferrous stator is formed as a ring-shaped fixed structure supported by a separate axle shaft, and a plurality of hybrid magnets 220 are mounted at regular intervals on the inner circumference surface of the ferrous stator 210.

Figure 3:
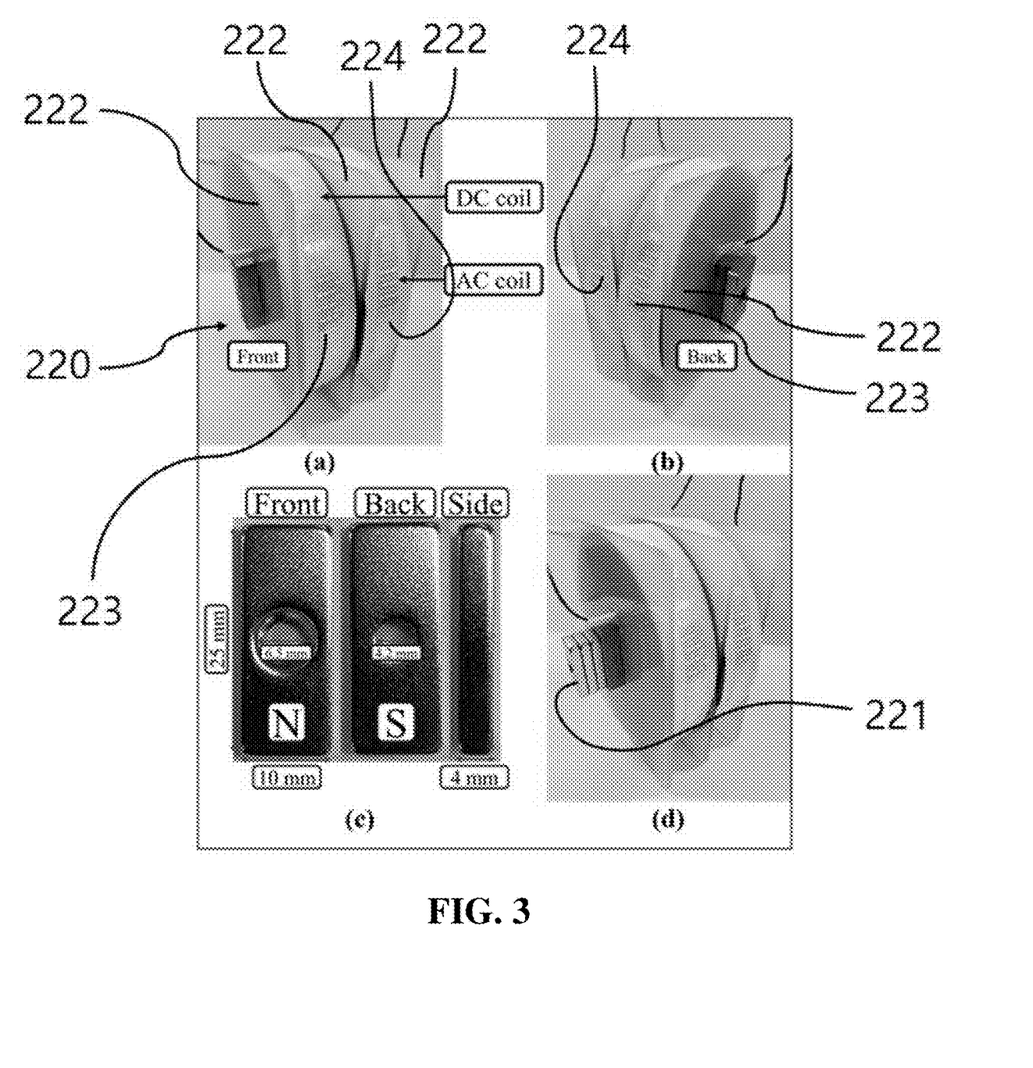
FIG. 3 is an exemplary diagram of a hybrid magnet according to the present invention.

In this instance, the hybrid magnet 220 is formed such that a permanent magnet 221 is placed at the frontmost position based on a circular center point of the ferrous stator 210 to generate a static magnetic field.

Accordingly, an inner electromagnet 223 partitioned based on an insulation plate 222 is provided behind the permanent magnet 221. The inner electromagnet 223 is formed to be connected to neighboring inner electromagnets.

In this instance, an outer electromagnet 224 partitioned based on the insulation plate 222 is provided behind the inner electromagnet 223. The outer electromagnet 224 is formed to be connected to neighboring outer electromagnets.

The inner electromagnet 223 is a DC electromagnet, and the outer electromagnet 224 is an AC electromagnet.

Figure 4:
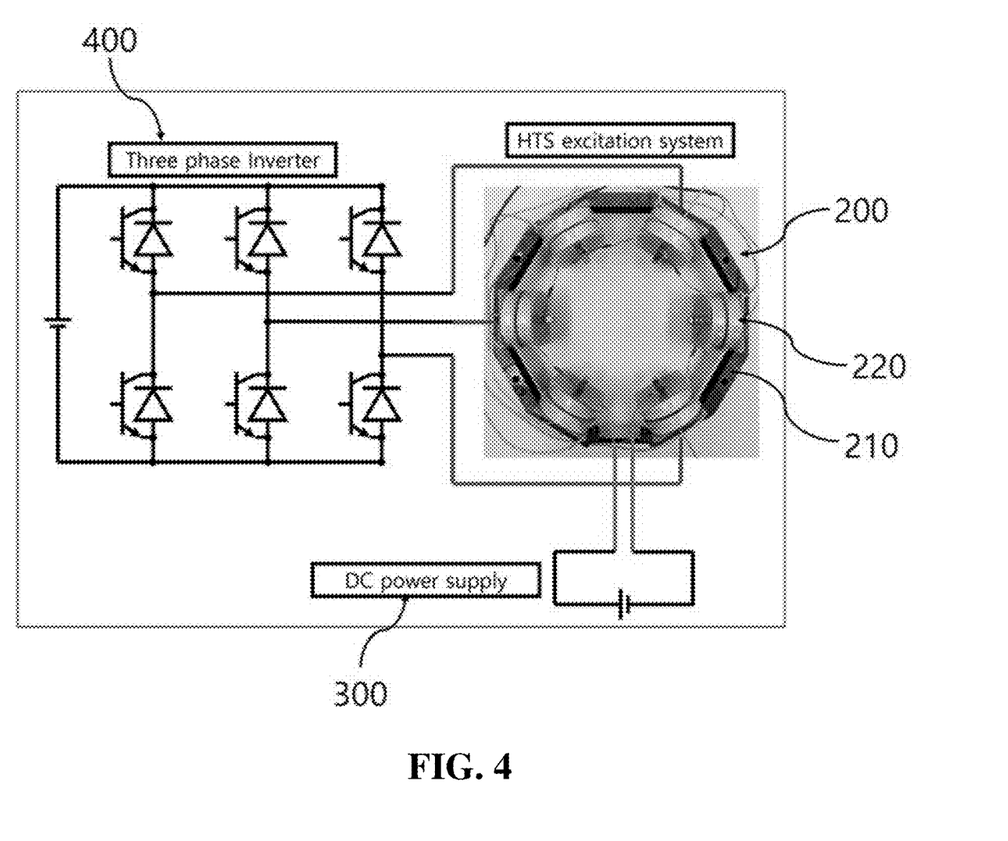
FIG. 4 is an exemplary diagram according to an embodiment of the present invention, illustrating a state in which inner electromagnets and a DC power source (power supply) are connected in series, and outer electromagnets and an inverter are connected in a three-phase form of a Y-shaped line.

The inner electromagnet 223 is formed to supplement the static magnetic field of the permanent magnet 221 by a DC power source 300 (power supply) after being connected in series with the neighboring inner electromagnets. The outer electromagnet 224 is formed to generate a rotor field capable of active control through an inverter 400 after being connected in a three-phase Y-shaped connection with selected outer electromagnets among other outer electromagnets.

Figure 9:
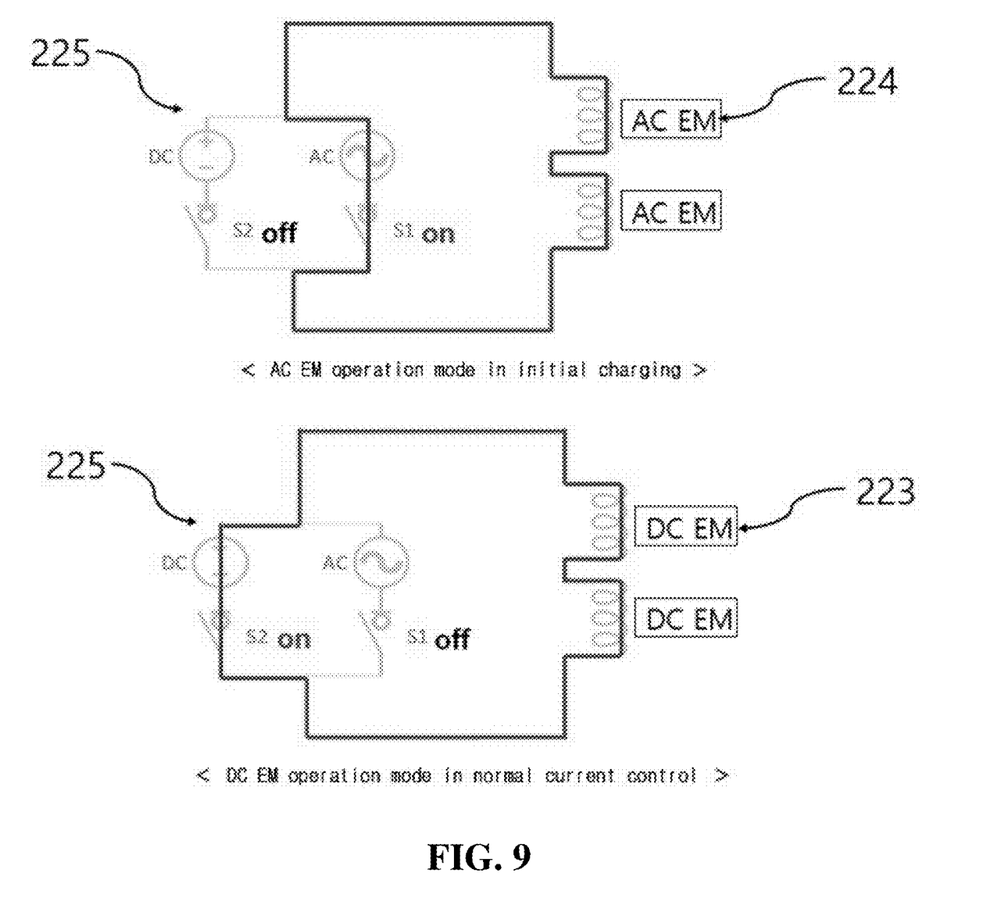
FIG. 9 is an exemplary diagram according to an additional embodiment of the present invention, illustrating an interlock transfer switch on a circuit.

Furthermore, the non-contact exciter stator 200 includes an interlock transfer switch 225 provided on a connection circuit between the inner electromagnets 223 and on a connection circuit between the outer electromagnets 224.

Figure 10:
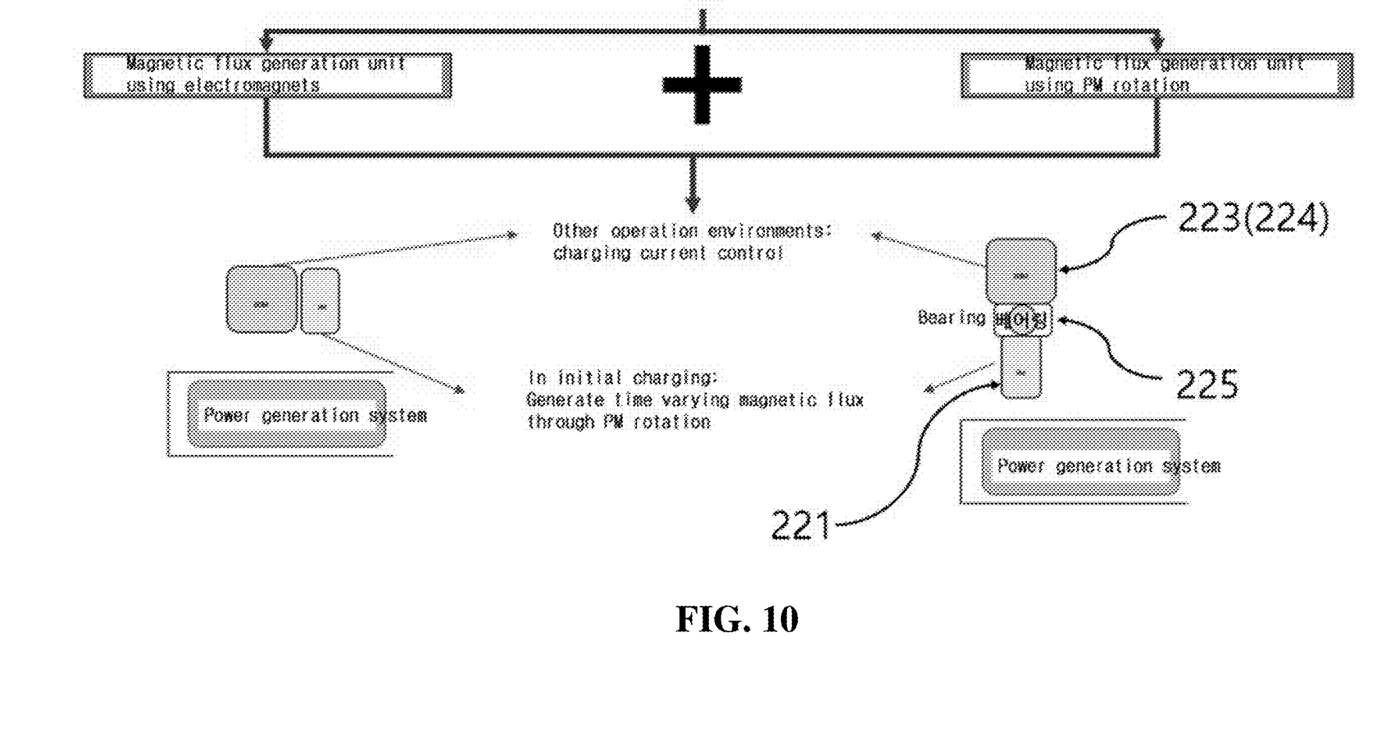
FIG. 10 is an exemplary diagram illustrating a permanent magnet which can be rotated (revolved) by a bearing or a rotor.

In this instance, a bearing or a rotary body 500 is provided on one side of the rear end portion of the permanent magnet 221. The permanent magnet coupled to the bearing or the rotary body 500 is formed to be rotated according to the setting by a separate servo motor or a drive device.

As illustrated in FIGS. 2 and 3, the hybrid magnet according to the present invention includes an alternating current electromagnet (AC EM), a direct current electromagnet (DC EM), and a permanent magnet (PM).

The hybrid magnet includes a magnetic support part made of a magnetic material to form a magnetic path for concentration of a magnetic flux generated.

At this time, the hybrid magnets are arranged on a hardware fixture at regular intervals in the circumferential direction in the form of a multiple of three.

Accordingly, the alternating current (AC) electromagnet located at the outermost position among the hybrid magnets is connected to an AC power source via a Y-connection to generate a three-phase rotating magnetic field (time-varying magnetic field or AC magnetic field).

It is to actively control the generated rotating magnetic field by controlling the frequency and magnitude of the applied current.

At this time, an inverter or frequency converter capable of controlling frequency, voltage, and current may be used as the AC power source.

Furthermore, the DC electromagnets are connected in series to a DC power source, so that the permanent magnet (PM) serve to supplement and assist the size of the magnetic field in various operation environments in which the static magnetic field (DC magnetic field) generated may be insufficient or excessive.

At this time, the permanent magnets are arranged at the innermost position of the hybrid magnets, and are configured to generate the most dominant DC magnetic field among the hybrid magnet configurations.

In the configuration of the rotor part of the contactless levitation system, the high-temperature superconductive wire is wound on a circular support part and the stator part interlinks with the generated AC and DC magnetic fields to generate DC voltage, thereby supplying power to the high-temperature superconductive coil of loads connected in series and parallel with the high-temperature superconductive wire.

In this case, the rotor part must be cooled to a temperature of 77K, which is the temperature of liquid nitrogen at temperature below the critical temperature of the superconductive material used, so that the high-temperature superconductive wire can enter a superconductive state and generate DC voltage in a non-contact manner.

Furthermore, the rotor part is connected to a motor capable of speed control in an axial direction, such that the DC electromagnet (DC EM) and the permanent magnet (PM) convert the generated DC (static) magnetic field into an AC (time-varying or rotating) magnetic field by using a relative speed difference through the rotation of the motor under the operation environment requiring the operation of the DC electromagnet (DC EM) and permanent magnet (PM)

In a power generation system to which the mentioned technology is applied, it is possible to simulate a prime mover that rotates the rotor part and simulate the rotation caused by the interaction between the electric coil and the field magnet in the motor system.

Figure 6:
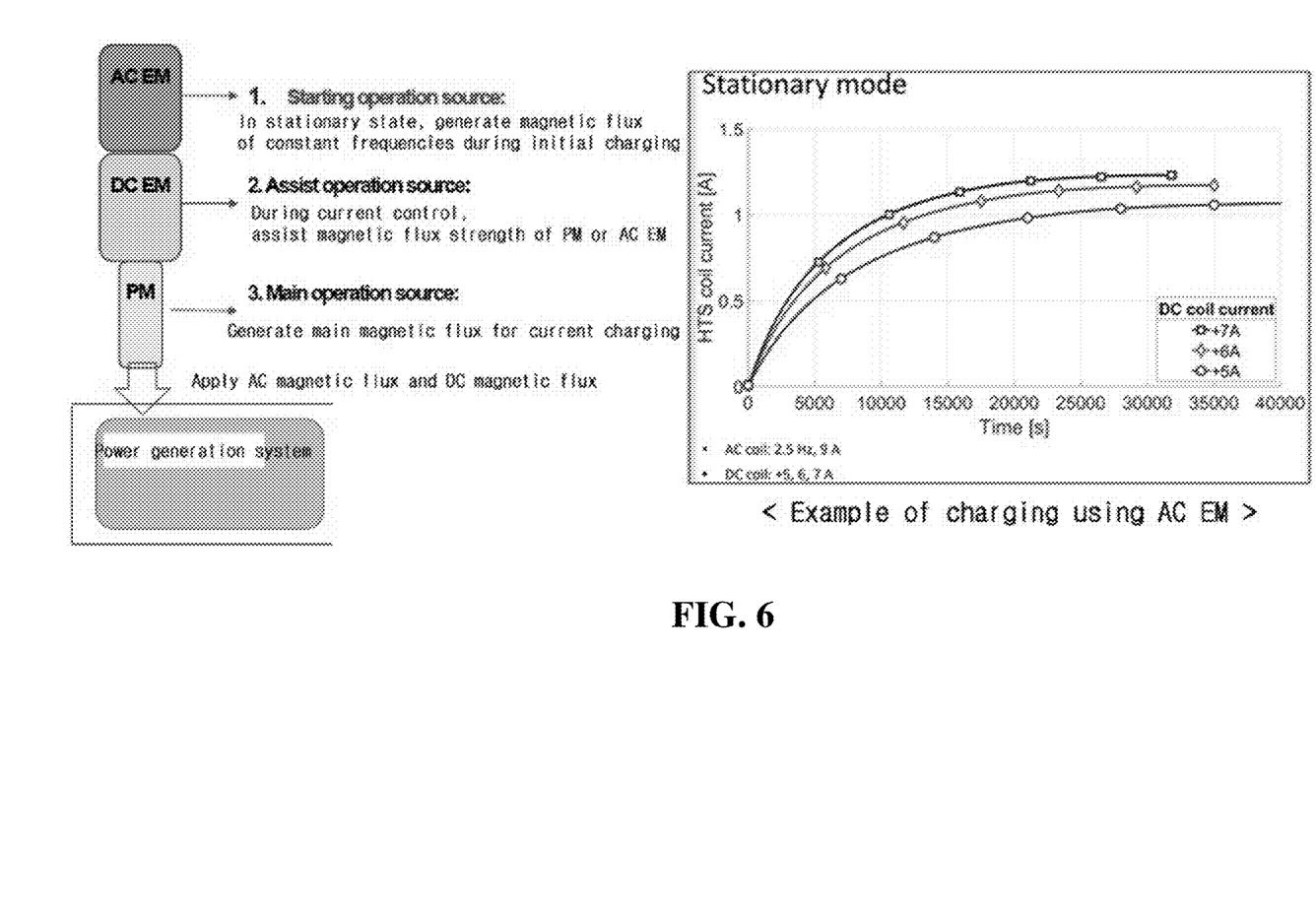
FIG. 6 is an exemplary diagram according to an embodiment of the present invention, illustrating an initial current charging state using alternating current (AC) electromagnets in the active current control-type non-contact superconductive exciter having a hybrid magnet installed therein.

[Embodiment 1] Initial Current Charging Operation of Non-Contact Superconductive Rotor with Hybrid Magnets (Refer to FIG. 6)

The high-temperature superconductive field wire of the rotor must be charged in a non-contact manner in a stationary state.

To achieve this, the AC electromagnet (AC EM) of the hybrid magnet is used for initial current charging to enable field current charging without physical rotation of the stator or rotor. The AC electromagnet (AC EM) is connected to a three-phase AC power source and generates a time-varying (or rotating) magnetic field having a specific direction according to input AC power.

The time-varying magnetic field generated in the stator interlinks periodically with the high-temperature superconductor wire in the rotor, which has been cooled to an ultra-low temperature and is in a superconductive state.

Accordingly, AC voltage is converted into DC voltage through DC rectification, and current is charged in a non-contact manner to the high-temperature superconductive coil (or superconductive field wire) of loads connected in series or parallel.

The control of frequency and current/voltage of the AC power enables control of the maximum size and speed of the current charged and saturated in the non-contact manner in the stationary state Moreover, in a case in which a high-temperature superconductive rotating machine is operated as an electric motor, if the capacity of the AC electromagnet (AC EM) is permitted, the AC electromagnet (AC EM) can excite field current capable of rated operation alone.

In addition, even if the capacity of the AC electromagnet (AC EM) is limited, excitation is possible with a minimum field current that can be synchronized with the rotor magnetic field generated by the armature located in the electric motor stator. After synchronization, when torque is generated and rotation occurs, the permanent magnet (PM) of the hybrid magnets causes relative time variation with the rotating magnetic field to charge the target field current.

At this time, the size and charging speed of the field current are influenced by the relative speed difference, that is, the rotational speed (frequency) of the rotating machine.

Accordingly, during normal operation of the rotating machine, under the operation environment requiring control of field current, the field current can be adjusted to be controlled to a desired target value by controlling the direction and size of the frequency of the AC power applied to the AC electromagnet (AC EM) and the size of the applied current.

Moreover, during the normal operation of the rotating machine, the field current charged by the non-contact rotor magnet in operation environment where rotor rotation speed control is required must maintain a constant value independent of the rotational speed control of the rotating machine.

In other words, it is possible to maintain the field current uniformly or control the field current in a specific value in response to a change in rotational speed and direction of the rotating machine by controlling the direction and size of the frequency of the AC power applied to the AC electromagnet (AC EM) and the size of the applied current.

Figure 7:
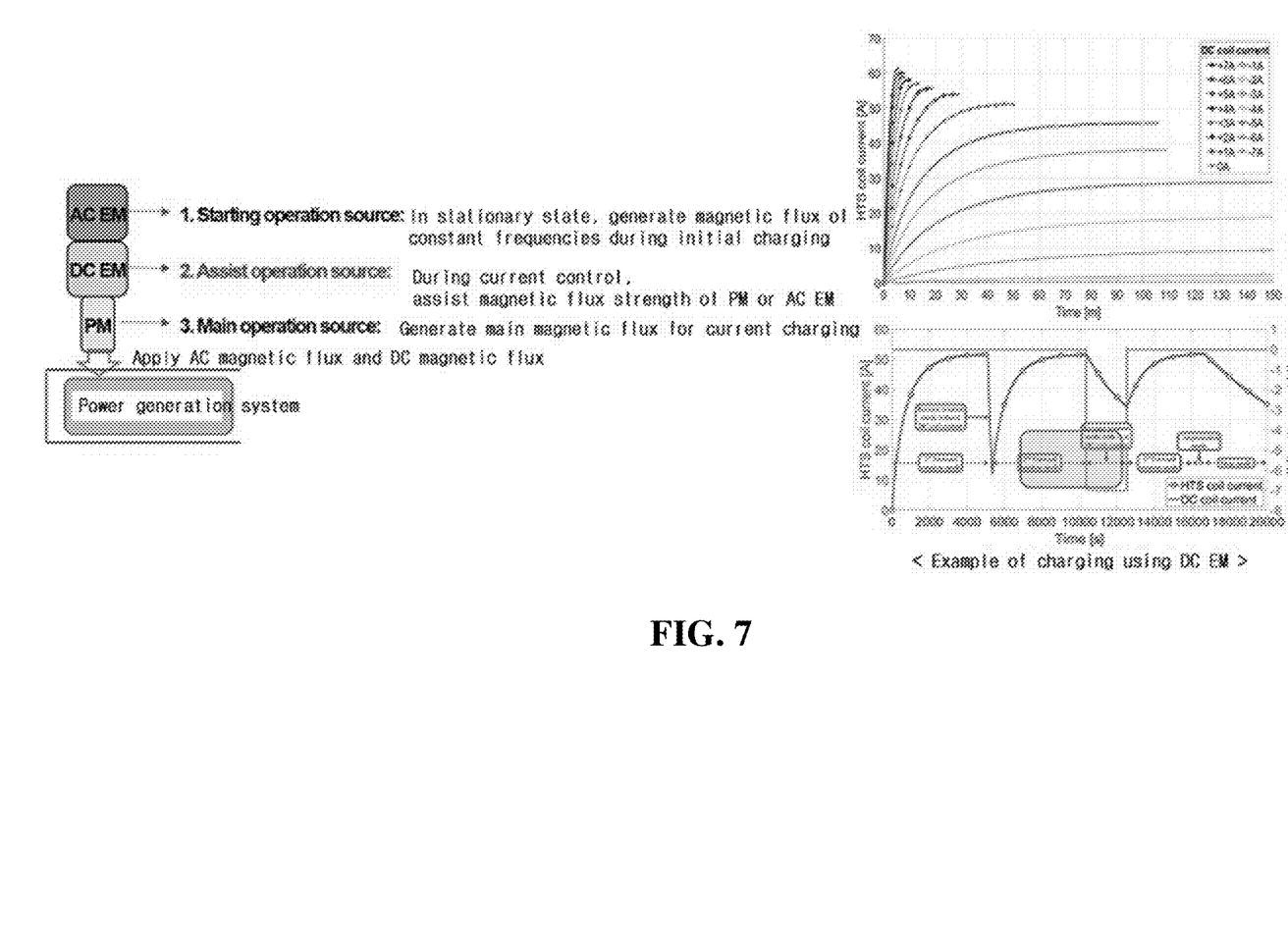
FIG. 7 is an exemplary diagram according to another embodiment of the present invention, illustrating a current charging state using direct current (DC) electromagnets in the active current control-type non-contact superconductive exciter having a hybrid magnet installed therein.

[Embodiment 2] Operating Current Control of Non-Contact Superconductor Rotor with Hybrid Magnets (Refer to FIG. 7)

When the non-contact current charging is completed with a certain value of current by the AC electromagnet (AC EM) in the initial charging operation, the high-temperature superconductive field wire of the rotor synchronizes with the armature wire and starts rotating.

In this state, the field current saturates to the required level for the rated operation through the relative time variation with the permanent magnet (PM) generating the main magnetic field.

At this time, the DC electromagnet (DC EM) is operated to increase or decrease the size of the main magnetic field generated by the permanent magnet (PM) to form a non-contact current charging control corresponding to various operation environments.

During normal operation of the rotating machine, in operation environments requiring the rotation speed control of the rotating machine, the field current charged by the non-contact exciter must maintain a constant value independent of the rotational speed control of the rotating machine.

Furthermore, by controlling the direction and size of the DC power applied to the DC electromagnet (DC EM), it is possible to control the field current to maintain a constant value or specific value in response to changes in the rotational speed and direction of the rotating machine.

During forward operation, under operation environment requiring operation at a lower current than the maximum saturated field current, it is possible to reduce the total magnetic flux interlinking by a demagnetizing mode that applies a negative current (i.e., a current generating a magnetic flux in the opposite direction of the permanent magnet (PM)) to the DC electromagnet (DC EM), and it is also possible to actively control the field current during normal operation of the rotating machine by controlling the current amount of the DC electromagnet (DC EM).

When the superconductive motor rotates in the forward direction and the hybrid magnet generates a (+) static magnetic field, the increased magnetic flux by supporting the permanent magnet interlinks with the high-temperature superconductive wire wound around the synchronous motor rotor shaft. In reverse operation, the operation environment must to charge current to the field coil rapidly and more.

Moreover, during reverse operation, under the operation environment where the rotational direction of the rotor must be reversed, the direction of the interlinked magnetic flux is reversed, causing the charging current to decrease. When the magnetic flux is constant, the charging current discharges to "0".

In this case, if the reverse rotation continues, the polarity of the charging current becomes negative, ultimately causing the field magnetic flux to have the opposite polarity.

So, the main magnetic flux of the field winding is decreased, and it reduces the generated torque, so causes the rotating machine to lose synchronization and functionality.

In order to prevent the above, a negative current (i.e., a current generating a magnetic flux in the opposite direction of the permanent magnet (PM)) can be applied to the DC electromagnet (DC EM) so as to reduce the total interlinked magnetic flux and decrease the amount of discharging current.

In other words, when the superconductive motor rotates in the reverse direction and the hybrid magnet generates the (−) static magnetic field, the static magnetic field generated by the permanent magnet is offset, such that sufficient magnetic flux is not interlinked with the high-temperature superconductive wire wound around the front (head) part of the synchronous motor rotor shaft, so discharge by the change in rotation direction does not occur.

Figure 8:
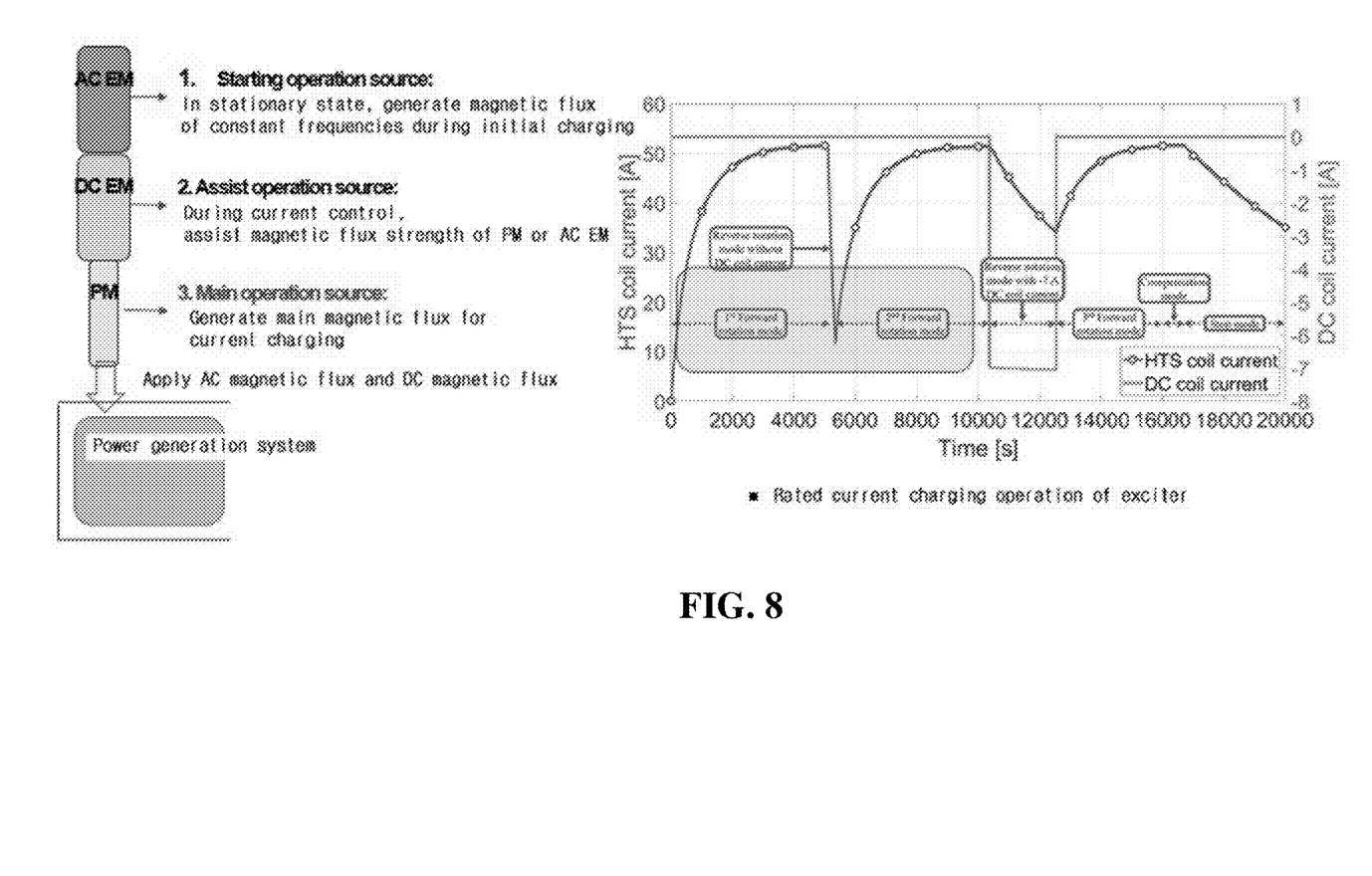
FIG. 8 is an exemplary diagram according to another embodiment of the present invention, illustrating a rated current charging state in the active current control-type non-contact superconductive exciter having a hybrid magnet installed therein.

[Example 3] Rated Current Control Operation of Active Current Control-Type Non-Contact Superconductive Exciter Having Hybrid Magnets (Refer to FIG. 8)

In the initial charging operation, the high-temperature superconductive field coil of the rotor, which is charged with a certain value of current through the non-contact current charging by the AC electromagnet (AC EM), begins to rotate in synchronization with the armature wire, and is saturated as field current required for rated operation through the relative time variation, that is, the rotating speed difference between the high-temperature superconductive field coil and the permanent magnet (PM) which generates most of the magnetic field required to generate a DC voltage of the exciter.

Although the above supplies most of the magnetic flux for the target current charging, since the direction and the magnitude of the magnetic field cannot be controlled, the superconductive exciter is formed to be operated in conjunction with the auxiliary control of the AC electromagnet (AC EM) or DC electromagnet (DC EM).

In this case, by positioning the permanent magnet (PM) of the hybrid magnet at the innermost angle, the total magnetic flux amount interlinked can be maximized by minimizing an electromagnetic gap (or physical distance) between the permanent magnet and the high-temperature superconductive wire of the rotor part.

[Example 4] Control Through Interlock Switching of Hybrid Magnet Wiring (Refer to FIG. 9)

During the production of the hybrid magnets, additional wiring and transfer switches can be used to form an additional circuit configuration between the AC electromagnet (AC EM) and DC electromagnet (DC EM).

Through the above, the magnitude of the AC magnetic flux generated by the AC electromagnet (AC EM) during the initial charging is increased, thereby enabling rapid charging with a larger current.

In other words, in a state in which the motor is stationary, the DC electromagnet (DC EM) and AC electromagnet (AC EM) of each hybrid magnet are connected in series, all hybrid magnets are connected in a Y-connection, and then, the rotor system is generated using AC power.

As described above, by switching the switch in the operating range where the DC electromagnet (DC EM) is operating, the AC electromagnet (AC EM) can be utilized as the DC electromagnet (DC EM).

Accordingly, the size of the rotating magnetic field generated by the permanent magnet (PM) is increased, thereby enabling an increase in the maximum saturated current charged to the high-temperature superconducting coil of the load.

In other words, in a state in which the motor is rotating, all DC electromagnets (DC EM) and AC electromagnets (AC EM) are connected in series, and the six hybrid magnets are connected in series with the DC power to generate a magnetic field in the radial direction. By interlock switching with each power supply, the capacity of each electromagnet operated in each operation mode can be expanded, thereby expanding the active control range of the current charged in a non-contact manner and increasing efficiency and precision of current control.

Figure 5:
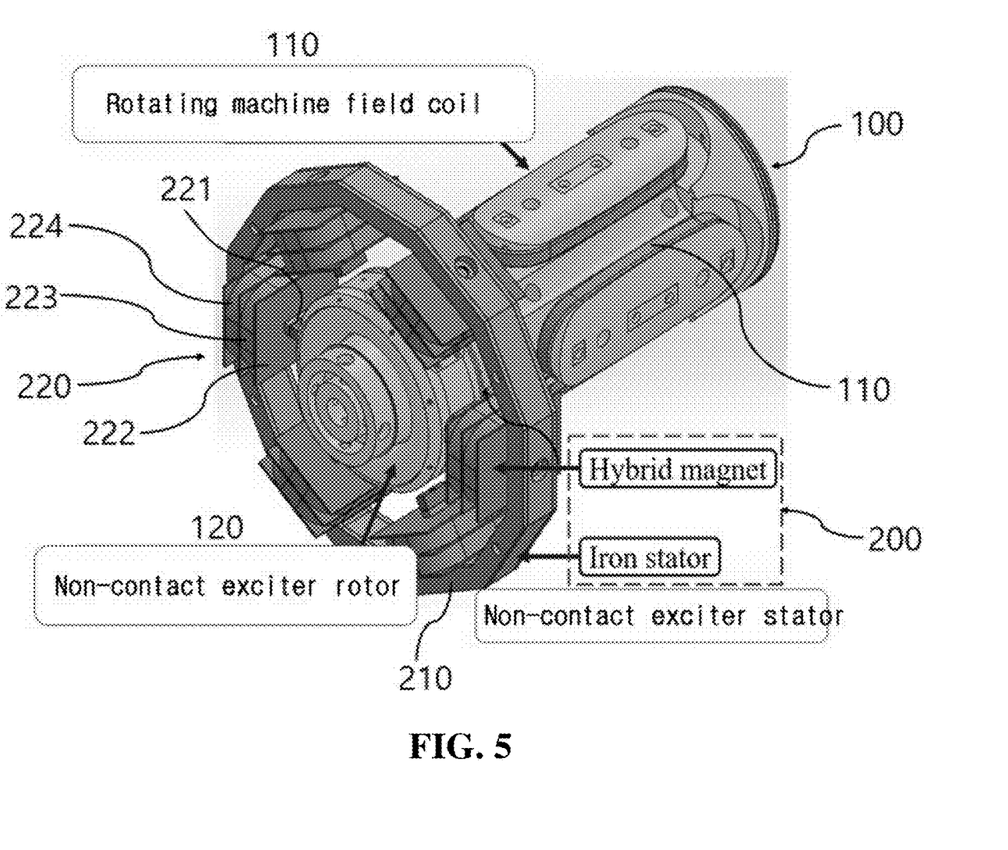
FIG. 5 is an exemplary diagram according to another embodiment of the present invention, illustrating a state in which an active current control-type non-contact superconductive exciter having a hybrid magnet installed therein is applied to a high-temperature superconductive rotating system.

[Example 5] Initial Current Charging Operation Utilizing the 3-Phase Rotor System of the Rotating Machine Rotor (Armature) (Refer to FIG. 5)

During the initial charging operation, contactless field current charging becomes possible by using the 3-phase rotor system generated with an inverter drive system connected to the stator (armature) equipped in the motor as an energy source, instead of the operation of the AC electromagnet (AC EM) of the hybrid magnet.

Therefore, the existing AC electromagnet (AC EM) is deleted to reduce the capacity and the size of the hybrid magnets. Moreover, if the AC electromagnet (AC EM) is used as the DC electromagnet (DC EM), the range of current control through the increased capacity of the DC electromagnet (DC EM) can be expanded.

[Example 6] Expansion of Active Current Control Range Using Rotating Permanent Magnets (Refer to FIG. 10)

By using a permanent magnet (PM) magnetic flux generation unit as a main source and using a DC electromagnet (DC EM) magnetic flux generation unit as an assist source, the permanent magnet (PM) magnetic flux generation unit is rotated at a constant speed during the initial field current charging till charging up to the field current capable of synchronization of the rotating machine. Thereafter, even if the rotation of the permanent magnet (PM) is stopped, the magnetic field induced by the permanent magnet (PM) has time variation due to the relative rotational speed of the rotor, and the current is charged in a non-contact manner up to the maximum saturated current.

In an operation environment requiring a constant control, an increase control or a decrease control of the field flux, the DC electromagnet (DC EM) is controlled actively, thereby enabling precise field current control to correspond various operation environments of the rotating machine.

In the above case, the DC electromagnet (DC EM) is used for the purpose of assisting the main source for precise control, and since most of the field currents are generated by the main magnetic flux of the permanent magnet (PM), the capacity and the size of the DC electromagnet (DC EM) is reduced.

The present invention is not limited to the specific preferred embodiments described above. Those skilled in the art will appreciate that various modifications can be made without departing from the essence of the present invention as claimed within the scope of the claims. Such modifications are within the scope of the claims listed in the claims.

INDUSTRIAL APPLICABILITY

As described above, the present invention has the following effects. The hybrid magnets are provided in a module form, in each of which a permanent magnet, a DC electromagnet and an AC electromagnet are mixed together. A plurality of hybrid magnets are set in a circumferential direction of a ring-shaped iron stator, are arranged to correspond to the outer side of a rotor having a second-generation high-temperature superconductive tape (or a second-generation high-temperature superconductive wire) of a non-contact superconductive exciter, and thus enables a selected operation (charging, discharging and the like) before and after a change of a rotational direction of a driving motor. Therefore, the present invention allows an active and immediate response to various operation environments such as starting current charging control, fixed field current control, field current control for magnetizing and demagnetizing control, field current and rotational direction change control in accordance with speed, and the like, thereby greatly enhancing an active control performance with respect to time-varying magnetic field compared to an existing technology.

The invention claimed is:

1. A testing apparatus for an active current control-type non-contact superconductive exciter, the testing apparatus comprising:
    a non-contact exciter rotor including a rotor having a high-temperature superconductive coil part on one side and a second-generation high-temperature superconductive tape (HTS tape) part on another side and configured to rotate around an axial line by a drive motor; and
    a non-contact exciter stator including a ring-shaped ferrous stator and a plurality of hybrid magnets,
    wherein the non-contact exciter stator is placed at a distance in an outer circumferential direction relative to the rotor having the second-generation high-temperature superconductive tape part, and the plurality of hybrid magnets is mounted at regular intervals on an inner circumference surface of the ferrous stator,
    wherein each of the plurality of hybrid magnet includes a permanent magnet, an inner electromagnet and an outer electromagnet,
    wherein the permanent magnet is placed at a frontmost position based on a circular center point of the ferrous stator to generate a static magnetic field, the inner electromagnet is partitioned based on an insulation plate and is provided behind the permanent magnet to be connected to neighboring inner electromagnets, and the outer electromagnet is partitioned based on the insulation plate and is provided behind the inner electromagnet to be connected to neighboring outer electromagnets.

2. The testing apparatus according to claim 1, wherein the inner electromagnet is a direct current (DC) electromagnet, and the outer electromagnet is an alternating current (AC) electromagnet.

3. The testing apparatus according to claim 2, wherein the inner electromagnet is formed to supplement the static magnetic field of the permanent magnet by a DC power source after being connected in series with the neighboring inner electromagnets, and the outer electromagnet is formed to generate a rotor field capable of active control through an inverter after being connected in a three-phase Y-shaped connection with selected outer electromagnets among other outer electromagnets.

4. The testing apparatus according to claim 1, wherein the non-contact exciter stator includes an interlock transfer switch provided on a connection circuit between the inner electromagnets and on a connection circuit between the outer electromagnets.

5. The testing apparatus according to claim 1, wherein a bearing or a rotary body is provided on one side of a rear end portion of the permanent magnet, and the permanent magnet coupled to the bearing or the rotary body is formed to be rotated according to a setting by a separate servo motor or a drive device.

6. A high-temperature superconductive rotating machine system including the testing apparatus of claim 1, the system comprising a 3-phase system including an inverter drive system connected to the ferrous stator equipped in a motor, wherein, during an initial charging operation, the 3-phase rotor system generates an energy enabling contactless field current charging.

7. A high-temperature superconductive rotating machine system including the test apparatus of claim 2, the system comprising a 3-phase system including an inverter drive system connected to the ferrous stator equipped in a motor, wherein, during an initial charging operation, the 3-phase rotor system generates an energy enabling contactless field current charging.

8. A high-temperature superconductive rotating machine system including the test apparatus of claim 3, the system comprising a 3-phase system including an inverter drive system connected to the ferrous stator equipped in a motor, wherein, during an initial charging operation, the 3-phase rotor system generates an energy enabling contactless field current charging.

9. A high-temperature superconductive rotating machine system including the test apparatus of claim 4, the system comprising a 3-phase system including an inverter drive system connected to the ferrous stator equipped in a motor, wherein, during an initial charging operation, the 3-phase rotor system generates an energy enabling contactless field current charging.

10. A high-temperature superconductive rotating machine system including the test apparatus of claim 5, the system comprising a 3-phase system including an inverter drive system connected to the ferrous stator equipped in a motor, wherein, during an initial charging operation, the 3-phase rotor system generates an energy enabling contactless field current charging.

\* \* \* \* \*